United States Patent [19]

Nagasawa

[11] Patent Number: 4,529,907
[45] Date of Patent: Jul. 16, 1985

[54] LIGHT EMITTING DISPLAY DEVICE

[75] Inventor: Hiroshi Nagasawa, Kawasaki, Japan

[73] Assignee: Tokyo Shibaura Denki Kabushiki Kaisha, Kawasaki, Japan

[21] Appl. No.: 199,627

[22] Filed: Oct. 22, 1980

Related U.S. Application Data

[63] Continuation of Ser. No. 969,259, Dec. 13, 1978.

[30] Foreign Application Priority Data

Dec. 15, 1977 [JP] Japan .................................. 52-150912
Jan. 17, 1978 [JP] Japan ..................................... 53-2718

[51] Int. Cl.³ ............................. H01J 1/62; H01J 63/04
[52] U.S. Cl. .................................... 313/499; 313/114; 313/512
[58] Field of Search ............... 313/498, 499, 501, 114, 313/512, 257, 259

[56] References Cited

U.S. PATENT DOCUMENTS 3,676,668  7/1972  Collins et al. ..................... 313/499
3,914,786 10/1975  Grossi ................................ 313/499

Primary Examiner—William L. Sikes
Assistant Examiner—Robert E. Wise
Attorney, Agent, or Firm—Oblon, Fisher, Spivak, McClelland & Maier

[57] ABSTRACT

A light emitting display device having a light emitting element mounted on a first reflector at the optical center of a reflective surface thereof and a second lead connected to the light emitting element with a metal wire, wherein in order to miniaturize the light emitting display device and to provide the light emitting display device with satisfactory characteristic as regards appearance when turned on, the first reflector, which is also used as a first lead to the device, has a cut-off portion. The second lead is disposed adjacent to the cut-off portion and the metal wire connecting the light emitting element to the second lead passes over the cut-off portion.

1 Claim, 8 Drawing Figures

LIGHT EMITTING DISPLAY DEVICE

This is a continuation of application Ser. No. 969,259, filed Dec. 13, 1978.

BACKGROUND OF THE INVENTION

This invention relates to a light emitting display device with an improved reflector.

DISCUSSION OF THE PRIOR ART

A reflector on which a light emitting element is mounted makes it possible to reflect substantially in one direction the light radially emitted from the light emitting element. A light emitting device with a reflector is known from the U.S. Pat. No. 3,764,862 in which the reflector having the reflective surface is also used as a first lead. A light emitting element is placed at the optical center of the reflective surface, which then surrounds the element, and the element is connected to the reflector by means of one electrode thereof. The other electrode of the light emitting element is connected to a second lead with a metal wire. Thus, the light emitting element assembly is provided. The light emitting element assembly is sealed with synthetic resin to form a capsule with parts of the leads extended outside the capsule. Thus, the light emitting display device has been formed.

The prior art light emitting display device described above exhibits the following disadvantages:

(1) The capsule is formed with resin poured into the cavity of a mold. In this case, as the reflector is in the form of a large cone, bubbles may be formed in the resin within the cone of the reflector while the resin is being poured into the cavity, thereby degrading the appearance of the light emitting display device when turned on.

(2) The metal wire connected to the other electrode of the light emitting element passes over the reflective surface, and therefore the metal wire is liable to be deformed. As a result, it is necessary to effectively insulate the metal wire and to prevent short-circuiting when the light emitting display device is manufactured.

(3) As the second electrode lead is to be spaced apart from the reflector connected to the first electrode lead in order to provide insulation therebetween, it is difficult to miniaturize the light emitting display device in view of physical dimensional limitations.

SUMMARY OF THE INVENTION

Accordingly, it is the object of this invention is to provide a novel light emitting display device free of the above described disadvantages. Thus, there is provided according to the invention a first reflector having a cut-off portion, thereby resulting in a light emitting display device of small size, exhibiting excellent visibility, and produced with improved manufacturing yield.

The advantage offered by the invention are mainly described as follows:

(1) As a portion of the first reflector is cut off or the reflector is substantially separated into two parts formed by a first reflector and a second reflector, bubbles can be exhausted through the distance between the first reflector and the second lead during encapsulation with a resin. Therefore, the light emitting display device is improved in appearance when turned on.

(2) The metal wire connecting the other electrode of the light emitting element to the second lead passes over the cut-off portion. Therefore, short-circuiting scarcely occurs between the electrodes.

(3) As the reflector is provided with the cut-off portion, the light emitting display device can be miniaturized considerably when compared with the prior art reflector.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
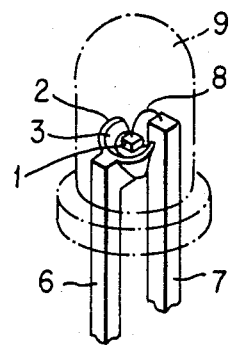
FIG. 1 is a perspective view of one embodiment of a light emitting display device in accordance with the invention.

Referring now to the drawings, wherein like reference numerals designate identical or corresponding parts throughout the several views, there is shown a light emitting display device comprising a light emitting element 1 mounted on a first reflector 2 extended to a first lead 6 at the optical center of a reflecting surface 3 and connected thereto with its one electrode, and a second lead 7 connected to the other electrode of the light emitting element 1 with a metal wire 8.

In accordance with the invention, a light emitting display device comprises a first reflector 2 which has a reflecting surface 3 surrounding the light emitting element 1 and which has a cut-off portion. The second lead 7 is so disposed as to be adjacent to the light emitting element 1. Therefore, the distance between the electrode of the light emitting element 1 and the bonding surface of the second lead 7 is shorter than that of the conventional reflector.

Figure 2:
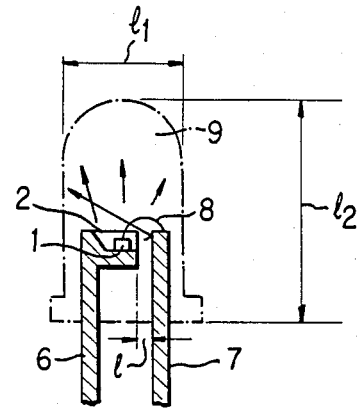
FIG. 2 is a sectional view of the embodiment shown in FIG. 1.

In accordance with a preferred embodiment of the invention, a light emitting display device of FIGS. 1 and 2 comprises a first reflector 2 having a cut-off portion adjacent to the second lead 7. In the light emitting display device, a recess is formed in the first reflector 2, a light emitting element 1 is provided in the recess of the first reflector 2, and the inner wall of the recess surrounding the light emitting element 1 is employed as a reflective surface 3. The angle between the reflective surface 3 and the flat bottom of the first reflector 2 on which the light emitting element 1 is mounted is about from 120° to 150°; preferably, 135°. A portion of the first reflector 2 that confronts the second lead 7 is cut off.

In this embodiment, the reflective surface 3 of the first reflector 2 does not completely surround a light emitting element 1 mounted thereon, but a portion of the first reflector 2 is removed on the side of the second lead 7. For the preparation of the reflector 7, a portion of the flat head portion of the first lead 6, which is closer to the second lead 7 is subjected to pressing to form the recess, and simultaneously a head portion is cut off (hereinafter referred to as a cut-off portion, when applicable), and therefore it is unnecessary to cut off the portion after the complete recess is formed. The light emitting element 1 is mounted on the flat bottom of the recess formed on the first reflector 2. A metal wire 8 is bonded to the electrode of the second lead 7. In addition, a resin lens 9 shown in FIGS. 1 and 2 is formed by molding and/or casting.

Next, the dimensions of the light emitting display devices will be described with reference to FIG. 2. While the lens diameter $l_1 = 4.5–5.5$ mm and the lens height $l_2 = 8.5–10$ mm in the case of the prior art light emitting device, the lens diameter $l_1 = 2.5–3.5$ mm and the lens height $l_2 = 4–6$ mm in the embodiment of FIG. 2. Thus, the size of the light emitting display device shown in FIG. 2 is reduced, because the cut-off portion is provided in the first reflector 2 and the distance between the leads 6 and 7 is decreased. In the case of the prior art light emitting display device, bubbles are liable to be formed in the recess of the first reflector 2 during manufacturing thereof. On the other hand, in the incomplete recess shown in FIG. 2, bubbles are readily removed through the cut-off portion of the first reflector 2, and the yield is considerably improved.

In the embodiment described above, only light beams emitted by the light emitting element 1 toward the cut-off portion of the first reflector 2 cannot be directed upwardly; however, almost all of the light beams emitted by the light emitting element are effectively directed upwardly.

That is, the light intensity of the light emitting device according to the invention is diminished by merely less than 10% of that of the prior art light emitting device in which the concave reflector for the light emitting device is employed.

Figure 3:
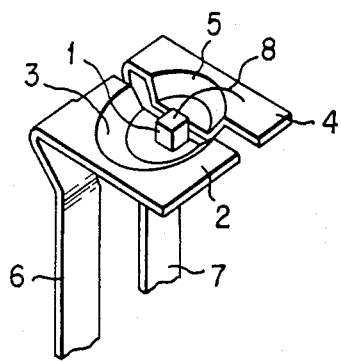
FIG. 3 is a perspective view of another embodiment of a light emitting display device in accordance with the invention.
Figure 4:
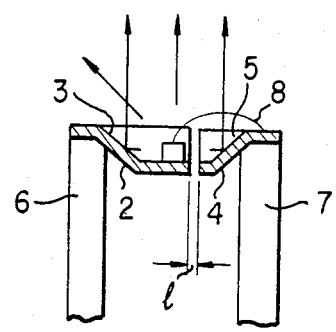
FIG. 4 is a sectional view of the embodiment shown in FIG. 3.

Referring now to FIGS. 3 and 4 which show another preferred embodiment of the invention, the second lead 7 is provided with a second reflective surface 5 which enhances the reflection efficiency in combination with the first reflective surface 3. The first and second reflective surfaces 3 and 5 are formed by pressing a portion of a first and second reflector 2, 4 in the form of a conical recess. On the flat bottom of the first reflector 2 the light emitting element 1 is placed. The first lead 6 is extended from a portion of the first reflector 2; the second lead 7 is extended from a portion of the second reflector 4. The second reflective surface 5 is electrically separated from the first reflective surface 2. The first and second reflective surfaces 3, 5 are disposed so as to surround the light emitting element 1.

The outward angle of the reflective surfaces 3, 5 from the flat bottom of the first reflector 2 to the reflective surfaces are approximately 120° and 150° with respect to the flat bottom of the first reflector on which the light emitting element is mounted. In FIGS. 3 and 4, reference numeral 8 again designates a metal wire connecting an electrode of the light emitting element to the bonding surface of a second lead 7. As is apparent from the figures, the total reflective surface is made up of two parts 3, 5. As shown in FIG. 4, some of the light beams emitted by the light emitting element 1 are led directly outside, while some of the light beams are reflected by the reflective surfaces 3, 5. The light beams reflected by the reflective surfaces 3, 5 can be effectively utilized, although there is a distance between the first and second reflective surfaces 3, 5.

Figure 5:
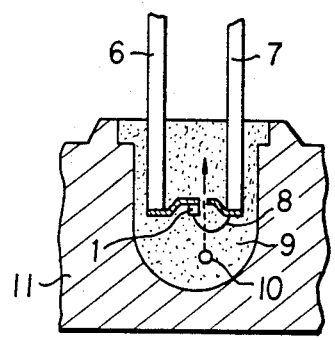
FIG. 5 is a view for illustrating the formation of the capsule of the embodiment shown in FIG. 3.

Referring now to FIG. 5, bubbles 10 which happen to be formed when the resin 9 is poured into the cavity of a mold 11 can be exhausted by passing through the distance between the two reflective surfaces 3, 5 (as indicated by the broken lines). As a result, the light emitting display of the invention exhibits excellent appearance and visibility when turned on.

Figure 6:
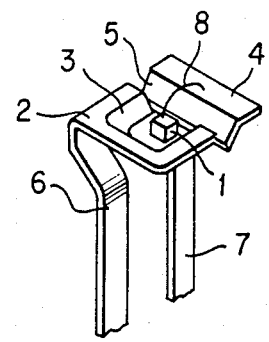
FIG. 6 is a perspective view of a further embodiment of a light emitting display device in accordance with the invention.
Figure 7:
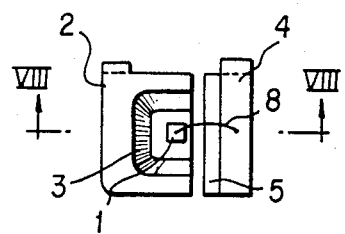
FIG. 7 is a plan view of the embodiment shown in FIG. 6.
Figure 8:
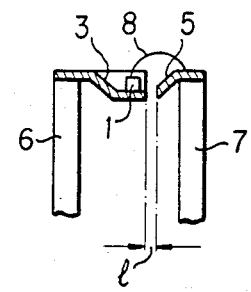
FIG. 8 is a sectional view taken through VIII—VIII of FIG. 7.

Further examples of the light emitting display device according to the invention are described with reference to FIGS. 6, 7 and 8. In this example, a light emitting display device having reflective surfaces 3, 5 in the form of a pyramid recess is shown in FIG. 6. The light emitting element 1 mounted on the flat bottom of the first reflector 2 is connected to the second reflector 4 by means of the metal wire 8. The reflective surface is in the form of a square when viewed from above as shown in FIG. 7. The reflector is divided into two parts in such a manner that one side of the square forming one of the two parts is spaced from the remaining three sides from the other part. FIG. 8 is a sectional view taken along the line VIII—VIII in FIG. 7. The first reflector 2 extended to the first lead 6 is spaced from the second reflector 4 extended to the second lead 7 by a distance l shown in FIG. 8. The configuration of the reflective surface in this example, that is to say the configuration of the pyramid recess, is particularly advantageous in that the reflective surface can be readily manufactured and especially the second reflective surface can be readily formed as compared with the embodiment shown in FIGS. 3 and 4.

Although the reflective surfaces 3 and/or 5 having a linear cross section are illustrated in FIGS. 4 and 8, the reflective surfaces 3 and/or 5 of curved cross section can be employed. Similarly, the combination of the reflector 2 and 4 in FIG. 4, and the reflector 4 and 2 in FIG. 8 respectively may be used.

It has been found preferable that the distance l between the first and second reflective surfaces shown in FIG. 8 is 0.25–0.3 mm when the thickness of the reflector plate is 0.35 mm.

This invention can be applied to a light receiving device, where a light receiving element replaced the light emitting element 1.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A method of making the light-emitting display device comprising a reflector with substantially conical face and a light-emitting element mounted on a surface within the reflector, the reflector surface comprising an opening therein, the method comprising the steps of inverting the display device and immersing the display device into a potting material, whereby bubbles in the potting material are allowed to rise through the opening in the reflector.

* * * * *